(12) United States Patent
Bolotnikov et al.

(10) Patent No.: US 9,121,953 B2
(45) Date of Patent: Sep. 1, 2015

(54) ARRAY OF VIRTUAL FRISCH-GRID DETECTORS WITH COMMON CATHODE AND REDUCED LENGTH OF SHIELDING ELECTRODES

(75) Inventors: Aleksey E. Bolotnikov, South Setauket, NY (US); Ge Yang, Moriches, NY (US); Giuseppe Camarda, Shoreham, NY (US); Yonggang Cui, Miller Place, NY (US); Anwar Hossain, Port Jefferson Station, NY (US); Ki Hyun Kim, Gyeonggi-do (KR); Ralph B. James, Ridge, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 331 days.

(21) Appl. No.: 13/695,899

(22) PCT Filed: May 2, 2011

(86) PCT No.: PCT/US2011/034773
§ 371 (c)(1),
(2), (4) Date: Jan. 2, 2013

(87) PCT Pub. No.: WO2011/139961
PCT Pub. Date: Nov. 10, 2011

(65) Prior Publication Data
US 2013/0126746 A1    May 23, 2013

Related U.S. Application Data

(60) Provisional application No. 61/330,432, filed on May 3, 2010, provisional application No. 61/368,366, filed on Jul. 28, 2010.

(51) Int. Cl.
*G01T 1/24* (2006.01)
*G01T 1/29* (2006.01)
*H01L 31/115* (2006.01)

(52) U.S. Cl.
CPC ............... *G01T 1/241* (2013.01); *G01T 1/247* (2013.01); *G01T 1/2928* (2013.01); *H01L 31/115* (2013.01)

(58) Field of Classification Search
CPC ....... G01T 1/241; G01T 1/247; G01T 1/2928; H01L 31/115
See application file for complete search history.

(56) References Cited

U.S. PATENT DOCUMENTS

| 5,530,249 | A | 6/1996 | Luke |
| 6,175,120 | B1 | 1/2001 | McGregor et al. |
| 7,223,982 | B1 * | 5/2007 | Chen et al. ............ 250/370.13 |

(Continued)

FOREIGN PATENT DOCUMENTS

SU    1264723 A    6/1986

OTHER PUBLICATIONS

International Search Report of International Application PCT/US2011/034773—Date of Completion of Search: Jun. 29, 2011, 8 pages.

(Continued)

*Primary Examiner* — David Porta
*Assistant Examiner* — Mindy Vu
(74) *Attorney, Agent, or Firm* — Dorene M. Price (57) ABSTRACT

A radiation detector system that solves the electron trapping problem by optimizing shielding of the individual virtual Frisch-grid detectors in an array configuration with a common cathode.

28 Claims, 9 Drawing Sheets

(56) References Cited

U.S. PATENT DOCUMENTS

2003/0034456 A1    2/2003  McGregor
2009/0026371 A1    1/2009  Bolotnikov

OTHER PUBLICATIONS

Bolotnikov, A., et al., "Performance Characteristics of Frisch-Ring CdZnTe Detectors," *IEEE Transactions on Nuclear Science*, vol. 53, pp. 607-614, 2006.
Cui, Y., et al., "Readout System for Arrays of Frisch-Ring CdZnTe Detectors," *IEEE Nuclear Science Symposium Conference Record*, vol. 6, pp. 3675 to 3679, 2006.
Polack, J., et al., "Variation of Electric Shielding on Virtual Frisch-Grid Detectors," *Nuclear Instruments and Methods in Physics Research A*, vol. 621, pp. 424-430, 2010.
Ramo, S., "Currents induced by electron motion," *Proceedings of the I.R.E.*, vol. 27, pp. 584-585, (1939).
Schockley, W., "Currents to conductors induced by a moving point charge," *Journal of Applied Physics*, vol. 9, pp. 635-636, (1938).
Bolotnikov, A., "Dual-Anode High Pressure Xenon Cylindrical Ionization Chamber," *IEEE Transactions on Nuclear Science*, vol. 51, No. 3, pp. 1262-1269, (2004).
Luke, P., et al., "Single-polarity charge sensing in ionization detectors using coplanar electrodes," *Applied Physics Letters*, vol. 65, No. 22, pp. 2884 to 2886, (1994).
Barrett, H., et al., "Charge Transport in Arrays of Semiconductor Gamma-Ray Detectors," *Physical Review Letters*, vol. 75 No. 1, pp. 156-159, (1995).
Parnham, K., et al., "Performance Improvement of CdZnTe Detectors Using Modified Two-Terminal Electrode Geometry," in: SPIE conference on Hard X-Ray, Gamma-Ray, and Neutron Detector Physics, *Proceedings of SPIE*, vol. 37, No. 68, pp. 49-54, (Denver, CO,1999).
Szeles, C. et al., "Fabrication of High Performance CdZnTe Quasi-Hemispherical Gamma-ray CAPture™ Plus Detectors," in: Hard X-Ray and Gamma-Ray Detector Physics VIII, edited by Franks, L., et al., *Proceedings of SPIE*, vol. 63, No. 19, pp. 191-198, (SPIE, Bellingham, WA, 2006).
Montemont, G., et al., "A Capacitive Frisch Grid Structure for CdZnTe Detectors," *IEEE Transactions on Nuclear Science*, vol. 48, pp. 4-9 to 4-12, (2001).
Bolotnikov, A., et al., "Performance Characteristics of Frisch-Ring CdZnTe Detectors," *IEEE Transactions on Nuclear Science*, vol. 53, No. 2 pp. 607-614, (2006).
Bolotnikov, A. et al., "*Optimization of virtual Frisch-grid CdZnTe detector designs for imaging and spectroscopy of gamma rays*," in: Hard X-Ray and Gamma-Ray Detector Physics VIII, edited by Franks, L., et al., *Proceedings of SPIE*, vol. 6706, pp. 670603-1 to 670603-14, (SPIE, Bellingham, WA, 2007).
Cui, Y., et al., "Readout System for Arrays of Frisch-ring CdZnTe Detectors," *IEEE Nuclear Science Symposium Record*, pp. 3675-3679, (Oct. 29-Nov. 1, San Diego, CA, 2006).

\* cited by examiner

ARRAY OF VIRTUAL FRISCH-GRID DETECTORS WITH COMMON CATHODE AND REDUCED LENGTH OF SHIELDING ELECTRODES

CROSS-REFERENCE TO A RELATED APPLICATION

This application is national phase entry of International Application No. PCT/US2011/034773, filed May 2, 2011, which claims the benefit under 35 U.S.C. 119(e) of U.S. Provisional Application Nos. 61/330,432 filed on May 3, 2010 and 61/368,366 filed on Jul. 28, 2010, the content of both is incorporated herein in their entirety.

STATEMENT OF GOVERNMENT LICENSE RIGHTS

This invention was made with government support under contract number DE-AC02-98CH10886, awarded by the U.S. Department of Energy. The Government has certain rights in the invention.

BACKGROUND

I. Field of the Invention

The present invention relates to the manufacture of devices for the detection of high-energy electromagnetic radiation (X- and y-rays). More particularly, the present invention relates to the manufacture and the use of the high-spectral resolution virtual Frisch-grid radiation detectors based on CdZnTe, CdTe, CdMnTe, $HgI_2$, TlBr, or other semiconductors capable of operating as single-carrier-transport devices.

II. Background of the Related Art

Semiconductor nuclear radiation detectors have experienced a rapid development in the last few years. They are now used in a large variety of fields, including nuclear physics, X-ray and gamma ray astronomy, and nuclear medicine. Their imaging capabilities, good energy resolution, and the ability to fabricate compact systems are very attractive features, in comparison with other types of detectors, such as gas detectors and scintillators. In recent years, a substantial effort has been invested in developing a range of compound semiconductors with wide band gap and high atomic number for X-ray and gamma ray detectors. These compound semiconductors are generally derived from elements of groups III and V (e.g. GaAs) and groups II and VI (e.g. CdTe) of the periodic table. However, besides binary compounds, ternary materials have been also produced, e.g. CdZnTe and CdMnTe. Among these compound semiconductors, cadmium telluride (CdTe) and cadmium zinc telluride (CdZnTe) are two of the most promising materials for radiation detectors with good energy resolution, high detection efficiency, and room temperature operation.

The drawback of the compound semiconductor based detectors of the prior art is that the amplitude of output signal is affected by the immobile holes left at the interaction point produced by the incident gamma ray. Since gamma rays interact randomly inside the detector's volume, the output signals depend on the locations of interaction points. Such behavior of the output signals, caused by immobile holes, is called the induction effect. This effect degrades spectral resolution of semiconductor detectors unless special measures are implemented to neutralize the holes.

There are two common ways to minimize the induction effect: (1) subtracting the fraction of the charge signal contributed by the stationary holes and (2) electrostatic shielding of the stationary holes. The validity of both techniques is consistent with the Ramo-Shockley theorem (S. Ramo, *Proc. IRE* 27, p. 584, 1939; W. Shockley, *J. Appl. Phys.* 9, p. 635, 1938; each of which is hereby incorporated herein by reference in its entirety).

In the first technique, the induced charge contributed by the holes is measured and electronically subtracted from the total output signal. (USSR Patent No. SU-1264723A; incorporated herein by reference in its entirety). The holes-induced signal can be measured with one or several electrodes adjacent to the collecting one. The electrodes can be comprised of pixels or strips and, depending on the locations of interaction points, the same electrode can be used for measuring collected or induced-only charges. The coplanar-grid devices proposed for CdZnTe, (P. N. Luke, *Appl. Phys. Lett.* 65 (22), pp. 2884-2886, 1994; U.S. Pat. No. 5,530,249; each of which is hereby incorporated herein by reference in its entirety), and fluid Xe detectors (A. Bolotnikov, et al., *IEEE Trans. Nucl. Sci.*, Vol. 51, n. 3, pp. 1006-1010, 2004; incorporated herein by reference in its entirety), are special cases of using this technique.

The second technique is based on developing an electrostatic shielding of the stationary holes. There are two types of devices which employ the electrostatic shielding: Frisch-grid and virtual Frisch-grid detectors. In the first type detectors, e.g., in a classic Frisch-grid ionization chamber, a metal grid (or mesh) is used for electrostatic shielding of the collecting electrode (or several collecting electrodes) from the positive ions (holes in the case of semiconductors). In the second type detectors, i.e., the virtual Frisch-grid detectors, the special grounded (or virtually grounded) electrode (or several electrodes) is made to produce essentially the same shielding effect as if a real Frisch-grid were placed inside the detector. In the past, several designs of the virtual Frisch-grid detectors were proposed for CdZnTe semiconductor: pixel detectors (H. H. Barrett, et al., *Phys. Rev. Lett.* 75 (1), p. 156, 1995; incorporated herein by reference in its entirety), CAPture™ (K. Parnham, et al., in *Hard X-Ray, Gamma-Ray and Neutron Detector Physics, Proceedings of SPIE*, 1999; incorporated herein by reference in its entirety), hemispherical, (C. Szeles, et al., in *Hard X-Ray and Gamma-Ray Detector Physics VIII*, edited by Larry A. Franks, et al., *Proceedings of SPIE* Vol. 6319 (SPIE, Bellingham, Wash., 2006); incorporated herein by reference in its entirety), and Frisch-ring, (U.S. Pat. No. 6,175,120; G. Montemont, et al., *IEEE Trans. Nucl. Sci.*, Vol. 48, pp. 278-281, 2001; each of which is incorporated herein by reference in its entirety).

Pixel Detectors

In the pixel detectors, the charge signal induced on a given pixel by the stationary charges is greatly reduced, because it is shared between other pixels. Therefore, for each individual pixel the other pixels (virtually grounded) act as an electrostatic shield (it is also called the "small-pixel effect").

CAPture™ and hemispherical detectors

Figure 1A:
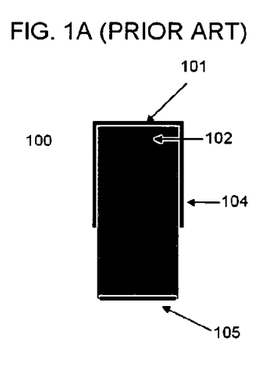
FIG. 1A illustrates the cross-sectional views of the CAPture™ detector according to Parnham (1999).

The CAPture™ and hemispherical detectors as shown in FIG. 1A are produced by extending the cathode electrode up the sides of the detector body 100. In both devices, the extended electrodes are in a physical contact with the semiconductor surfaces. As a result, a wide area of the bare surface surrounding the anode is required to keep the surface leakage current below an acceptable level.

Frisch-Ring Detectors

Figure 1B:
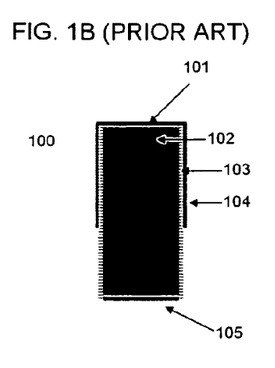
FIG. 1B illustrates the cross-sectional views of the Frisch-ring detector according to U.S. Pat. No. 6,175,120, Montemont (2001) and Bolotnikov (2006).

As shown in FIG. 1B, in the existing Frisch-ring detectors (U.S. Pat. No. 6,175,120, Montemont, 2001; Bolotnikov, 2006), the cathode is also extended up the sides of the detector as in the CAPture™ and hemispherical detectors (see FIG. 1A), but the extended portion of the cathode is physically separated from the semiconductor surfaces by a thin layer of insulating material. The non-contacting electrode (also known as the non-contacting Frisch-ring; U.S. Pat. No. 6,175,120; incorporated herein by reference) is the main feature that makes Frisch-ring detectors different from CAPture™ and hemispherical-type devices.

In the Frisch-ring detectors the non-contacting electrode is placed on the side surfaces of the crystal and physically connected to the cathode, as illustrated in FIG. 1B. (U.S. Pat. No. 6,175,120, Montemont, 2001; Bolotnikov, 2006). A common high-voltage bias (with respect to the anode) is applied to the cathode and the ring, while the output signal is read out from the anode. This configuration requires a gap of about 2-3-mm of the unshielded surface to be left near the anode's contact to prevent high leakage current or even possible discharge in the area between these two electrodes. As a result, an electrostatically unshielded area of the surface exists near the anode.

Overall, previously known designs of virtual Frisch-grid detectors (e.g., FIG. 1A and FIG. 1B) have two common problems that affect their spectroscopic performances. The first problem is the presence of the unshielded area near the anode (see FIG. 1A and FIG. 1B) and the second problem is related to the fact that the original virtual Frisch-grid detectors are essentially two-terminal devices in which the cathode signal cannot provide the particle's interaction depth information to correct the electron losses due to electron trapping (Bolotnikov, 2006). For thin detectors the electron trapping has little effect on the detection performance and can be neglected. However, this problem must be solved for thick detectors longer than about 10 mm, usually employed by virtual Frisch-grid detectors, where electron trapping can be significant.

Figure 1C:
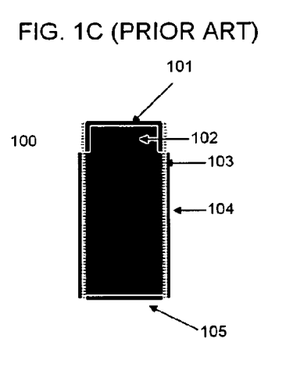
FIG. 1C illustrates the cross-sectional views of the virtual Frisch-grid detector according to Bolotnikov (2007).

Recently, a new design of virtual Frisch-grid detectors has been proposed to address the above problems, which lead to improved performance of this type of devices (Bolotnikov, et al., in *Proceedings of SPIE Hard XRay and Gamma-Ray Detector Physics VIII*, Vol. 6702, edited by L. A. Franks, et al., (SPIE, Bellingham, Wash., 2007); incorporated herein by reference). A schematic of the device is shown in FIG. 1C. A rectangular shaped crystal (bar) 102 has the geometrical aspect ratio (a ratio of its length to its width) of 2 or more as in the existing Frisch-ring devices, e.g., FIG. 1B (Bolotnikov, 2006). The cathode metallization 101 is extended 2-3 mm up to the side surfaces. The non-contacting ring 104 covers the device's side surfaces up to the cathode's 101 edge and is kept at the same potential as the anode 105. The insulating layer 103, e.g., the ultra-thin polyester shrink tube, covers the entire area of the side surfaces. This provides decoupling of the non-contacting ring 104 and the cathode 101 and, at the same time, allows one to apply high differential bias (up to 3000 V and higher) between the cathode 101 and the shielding electrode 104 (non-contacting ring). In turn, the decoupling of the cathode allows for implementing the cathode readout scheme, and enables those skilled in the art, first, to correct for electron trapping and, second, to reject the events interacting near the anode 105 which contribute to the background.

However, this design is not optimal for achieving the full capabilities of the cathode readout scheme to correct the charge loss due to trapping. There are contradicting requirements in this approach. To ensure strong shielding effect of the virtual Frisch grid, the shielding electrode on the crystal's side should cover the entire area of the device's surface as shown in FIG. 1C. But when the entire detector is shielded, very few signals can be detected by the cathode. This makes the cathode insensitive to the events interacting deep inside the detector. On the other hand, it is critical for the good detector performance to be able to detect all events within the crystal and even those that interact close to the anode.

Therefore, it will be desirable to have a virtual Frisch-grid detector(s) and an array of virtual Frisch-grid detectors that effectively reduce the electron trapping problem in the moderately to substantially thick detector crystals, while avoiding the shortcomings of the prior art.

SUMMARY

Having recognized that the contradiction in the virtual Frisch-grid design(s) of the prior art creates a problem of correcting the charge loss due to trapping, we have invented a novel virtual Frisch-grid design for detector(s) and detector arrays that efficiently shield the anode from the immobile holes at the same time as allowing for reading the cathode signals required for correcting the charge loss due to electron trapping. We recognized that while a large aspect ratio of the individual detector and the presence of the common cathode enhance the virtual shielding effect, a wide area near the cathode in each detector from the array can be left uncovered by the shielding electrode without lowering the effectiveness of shielding the anode. By placing the narrow shielding strip near the anode and leaving the large surface area near the cathode unshielded maintains the sensitivity of the detector to the interaction events taking place from the cathode down to the anode and, in particular, allows us to apply the charge-loss corrections for nearly all interaction events. We recognized that the width of the shielding electrode should be just enough to provide shielding of the anode, i.e., as narrow as possible. However, the actual width of the shielding electrode may be optimized for a particular configuration of the semiconductor detector, as long as its location is near the anode and its length is enough to provide shielding of the anode.

The radiation detection system of the present invention comprises a virtual Frisch-grid detector array made of a plurality of virtual Frisch-grid detectors and one or more processing units. In one particular embodiment, as shown in FIG. 2, the radiation detection system of the present invention comprises a virtual Frisch-grid detector array made of a plurality of virtual Frisch-grid detectors, an application-specific-integrated-circuit (ASIC) connected to the virtual Frisch-grid detector array for receiving a signal from said array, and a microprocessor connected with the ASIC for operating the ASIC, where signals received by the array, are processed through the ASIC, and subsequently further processed by the microprocessor.

It will be appreciated and understood by those skilled in the art that in order to overcome the problem caused by electron trapping, the best practical approach is to use the cathode signal to correct the anode's charge loss due to electron trapping. However, since the shield in the virtual Frisch-grid detectors of the prior art may extend from the anode up to the cathode, i.e., the full length, in order to ensure a strong shielding effect of the virtual grid, the cathode becomes insensitive to the events occurring deep inside the detector, and thereby, very few signals can be detected by the cathode. To overcome this limitation, we have determined that each virtual Frisch-grid detector may be optimized individually by (1) varying the length of the shielding electrode, (2) optimizing the location of the shield along the detector length, (3) maintaining the optimal aspect ratio of the detector crystal, and (4) using the common cathode signal to implement the correction of charge loss within the detector array. In a preferred embodiment, to overcome this limitation, the shielding electrode in each detector (1) has sufficient length to provide shielding of the anode, and (2) positioned near the anode, thereby, extending sensitivity of the cathode to the areas up to the anode.

The radiation detection system of the present invention is defined by a plurality of virtual Frisch-grid detectors. Each virtual Frisch-grid detector comprises a compound semiconductor capable of operating as a single-carrier-transport device. The compound semiconductor is prepared to conform in size to have an aspect ratio of at least 2 (e.g., see FIGS. 4A-4C). For instance, if the width is about 6 mm, than the height must be at least about 12 mm. As shown in FIGS. 5A-5D, an anode is connected to the first surface of the semiconductor, and a cathode is connected to the second surface of the semiconductor. It is contemplated that the cathode may be designed to cover only one surface of the semiconductor (see FIG. 5A), or it may be designed to extend to the sides of the semiconductor (see FIG. 5B). The virtual Frisch-grid detector further comprises a side insulating layer between the side surface of the semiconductor and the metal shielding electrode to produce the same effect as if the virtual Frisch-grid were actually placed inside the detector body. In one non-limiting embodiment of the present invention, the compound semiconductors that may be employed in the present invention are generally derived from elements of groups III and V (e.g. GaAs) and groups II and VI (e.g. CdTe) of the periodic table. Among these compound semiconductors and their alloys, in one embodiment, cadmium telluride (CdTe), cadmium zinc telluride (CdZnTe), cadmium manganese telluride (CdMnTe), thallium bromide (TlBr), or mercuric iodide ($HgI_2$) is used.

Figure 2:
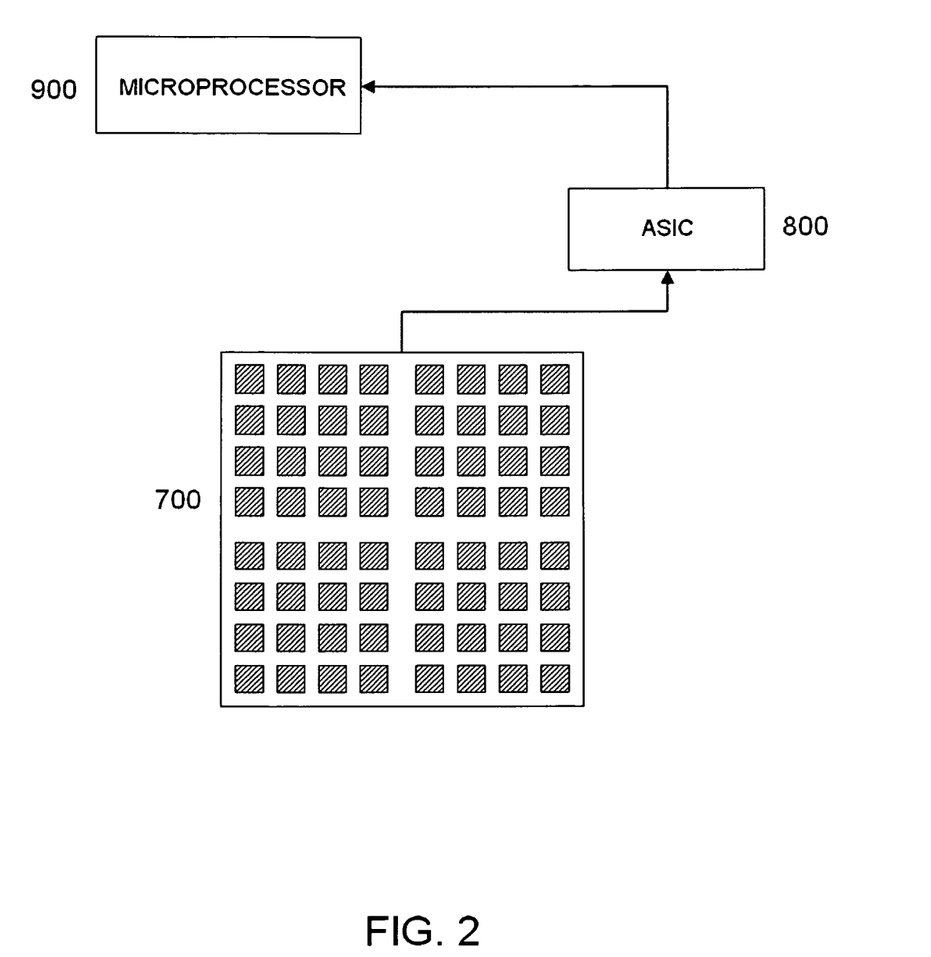
FIG. 2 illustrates a block diagram of a radiation detector system, which comprises interconnected virtual Frisch-grid detector array, an application-specific-integrated-circuit (ASIC), and a microprocessor.
Figure 3:
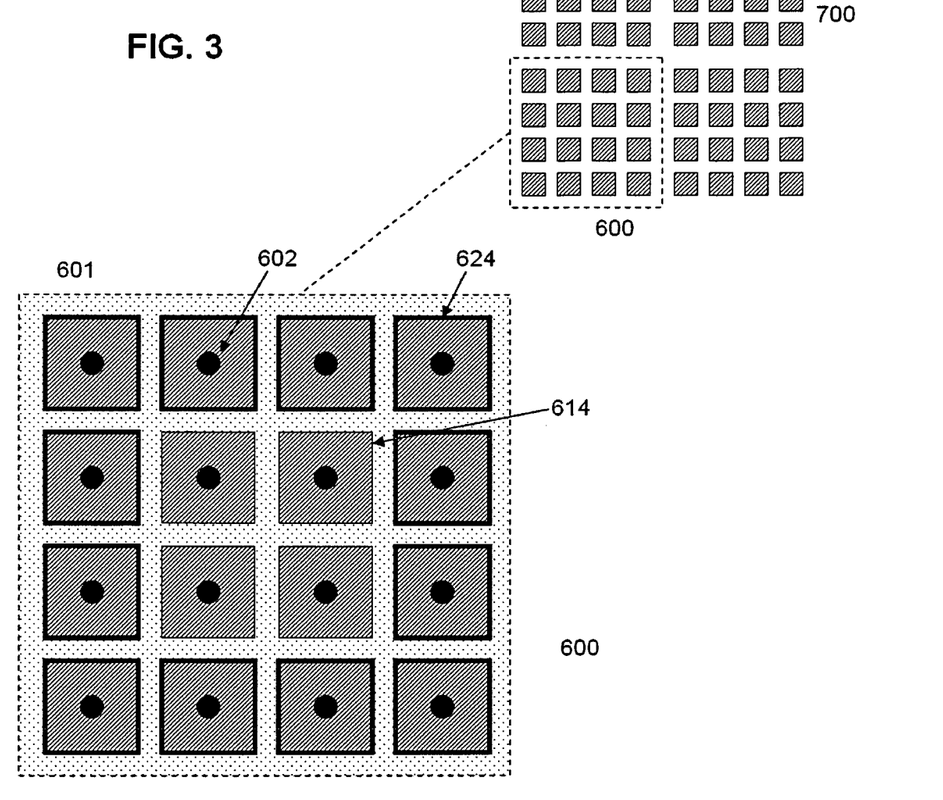
FIG. 3 illustrates a diagram of a plurality of 4×4 arrays of virtual Frisch-grid detectors according to FIG. 2.

The radiation detection system of the present invention is further defined by an arrangement of the plurality of virtual Frisch-grid detectors in an array or multiple arrays (see FIG. 2 and FIG. 3). In one non-limiting embodiment, every detector within an array is connected to form a common cathode. However, it is also envisioned that the detectors within the array may have two or more subgroups of virtual Frisch-grid detectors that are connected to a common cathode.

Figure 4A:
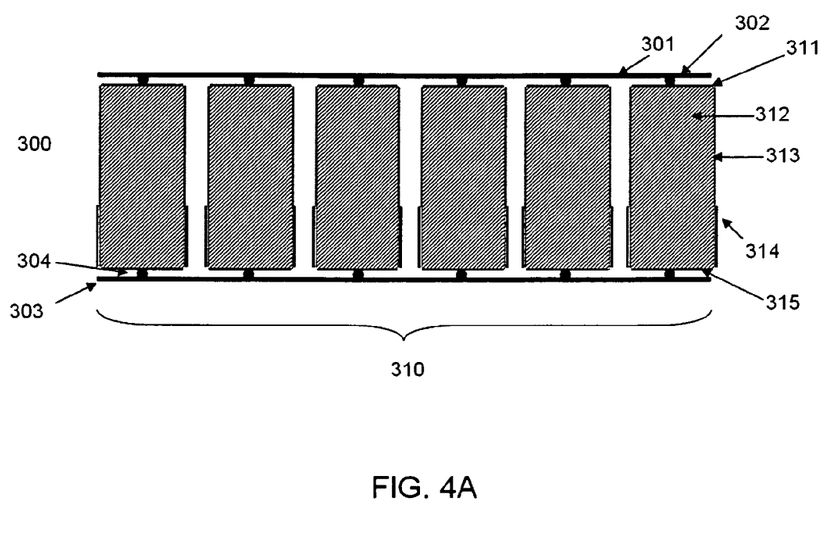
FIG. 4A illustrates one row of a 6×6 virtual Frisch-grid detector array that reduces the electron trapping problem.

In one embodiment, as shown in FIG. 4A, each virtual Frisch-grid detector within the array has a shielding electrode positioned near the anode and extending a partial length of a semiconductor, thus, leaving the semiconductor bar within the virtual Frisch-grid detector partially unshielded. The inventors have recognized that a wide area near the cathode in each detector from the array can be left uncovered by the shielding electrode without lowering the effectiveness of shielding the anode.

Figure 4B:
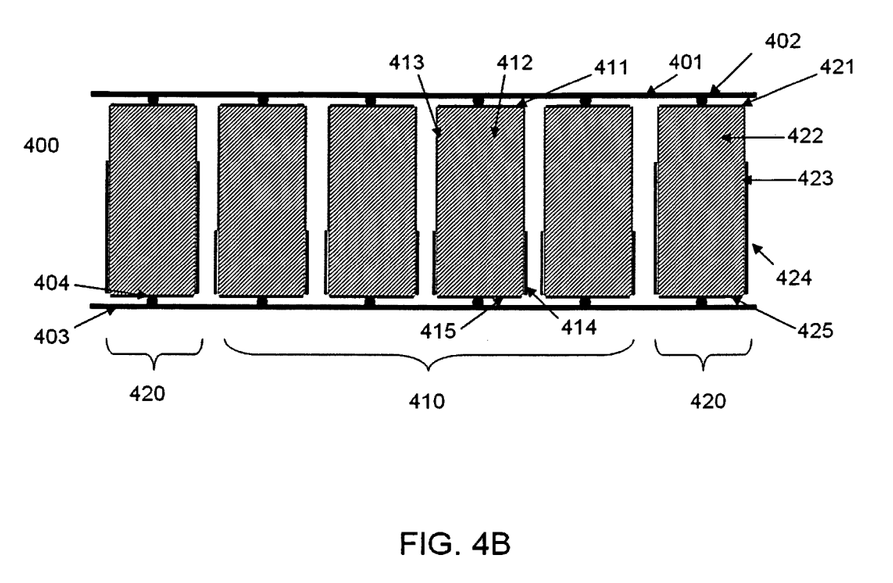
FIG. 4B illustrates one row of a 6×6 virtual Frisch-grid detector array that reduces the electron trapping problem similar to FIG. 4A, however, wherein the length of the shielding electrode differs between the internal and external modules.

In another embodiment, as shown in FIG. 4B, each virtual Frisch-grid detector within the array has a shielding electrode near the anode extending a partial length of a semiconductor bar, thus, leaving the semiconductor bar within the virtual Frisch-grid detector partially unshielded. However, in this embodiment, each array is composed of the internal and external (or edge) modules of virtual Frisch-grid detector, where the length of the shield of the detectors in the internal module differs from the length of the shield of the detectors in the external module. In one embodiment, the length of the shield of the detectors in the external module is greater than the length of the shield of the detectors in the internal module, yet not the full length of the semiconductor as described in the embodiment described infra.

Figure 4C:
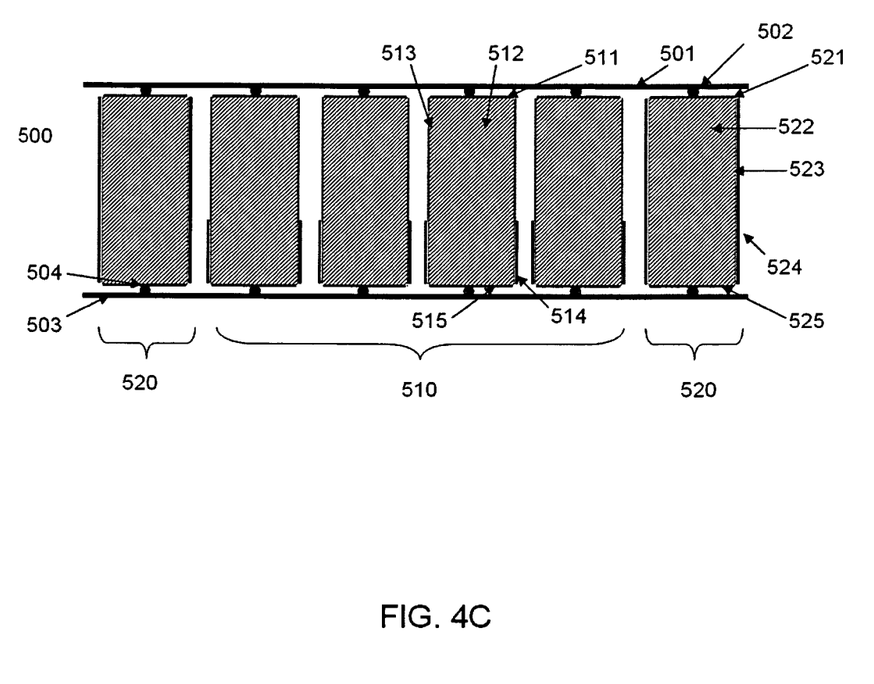
FIG. 4C illustrates one row of a 6×6 virtual Frisch-grid detector array that reduces the electron trapping problem similar to FIG. 4B, wherein the edge modules use the full length of the shielding electrode.

In a preferred embodiment, as shown in FIG. 4C, each array is composed of the internal and external (or edge) modules. The internal module comprises a plurality of virtual Frisch-detectors with a shield near the anode extending a partial length of a semiconductor, leaving the semiconductor within the virtual Frisch-grid detector in the internal module partially unshielded similar to FIG. 4A and FIG. 4B. However, the external or edge module, on the other hand, comprises a plurality of virtual Frisch-detectors with the shield extending the full length of the semiconductor. A top view of an exemplary embodiment of such configuration is presented in FIG. 3, where four (4) internal detectors form an internal module and twelve (12) external detectors that surround the internal module form the external or edge module. In such configuration, the cathodes of the plurality of detectors in the array are read together, and the interaction depth information derived from the cathode signal of the internal module in the virtual Frisch-grid detector array is used to correct the anode's charge loss due to electron trapping of the whole array system. The time information and amplitude of the cathode signals can be used to reject the events interacting close to the anode. This provides a practical approach to use the cathode signal of the internal module to correct the anode's charge loss due to trapping and reject those events occurring near the anode that cannot be properly corrected by depth sensing based on the cathode signal.

The present invention also provides a method of manufacturing a virtual Frisch-grid detector array comprising the steps of a) providing (i) a plurality of virtual Frisch-grid detectors with the shielding electrode spanning the partial length of the compound semiconductor near the edge closest to the anode, and (ii) a plurality of virtual Frisch-grid detectors with the shielding electrode spanning the entire length of the compound semiconductor; or, in alternative, b) providing a plurality of virtual Frisch-grid detectors with the shielding electrode spanning the partial length of the compound semiconductor near the edge closest to the anode; c) bonding the virtual Frisch-grid detectors of step (a) or (b) to a conductive board to form an array; wherein, under alternative (a), the plurality of virtual Frisch-grid detectors with the shielding electrode spanning the partial length of the compound semiconductor near the edge closest to the anode form an internal module and the plurality of virtual Frisch-grid detectors with the shielding electrode spanning the entire length of the compound semiconductor form an external or edge module. The external module is bonded to the conductive board (or other conductive material) in a pattern to form a singular detector edge layer around the internal module. However, multiple layers of the outer edge detectors are also envisioned, as are multiple internal modules framed by a layer of outer edge detectors.

The objectives, features and advantages of the present invention will be apparent from the following detailed description of the invention, which is to be read in conjunction with the accompanying drawings. The scope of the invention will be pointed out in the claims. The following drawings, taken in conjunction with the subsequent description, are presented to enable one of ordinary skill in the art to make and use the invention and to incorporate it in the context of particular applications.

Various modifications, as well as a variety of uses in different applications, will be readily apparent to those skilled in the art, and the general principles, defined herein, may be applied to a wide range of embodiments. Thus, the present invention is not intended to be limited to the embodiments presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

DETAILED DESCRIPTION

The present invention is directed to a novel radiation detector system that effectively solves the electron trapping problem of the prior art detectors by optimizing the configuration of each individual virtual Frisch-grid detector in an array configuration.

As shown in FIG. 2, in one embodiment, the radiation detector system of the present invention comprises a virtual Frisch-grid detector array 700 made of a plurality of virtual Frisch-grid detectors, an application-specific-integrated-circuit (ASIC) 800 connected to the virtual Frisch-grid detector array 700 for receiving a signal from said array, and a microprocessor 900 connected with the ASIC 800 for operating the ASIC, where signals received by the array 700, passed through the ASIC 800, and processed by the microprocessor 900. The configuration and components of the radiation detector system of the present invention are discussed in detail herein below.

Virtual Frisch-Grid Detector Array

It will be appreciated and understood by those skilled in the art that in order to overcome the problem caused by electron trapping, the best practical approach is to use the cathode signal to correct the anode's charge loss due to trapping. However, since the shield in the virtual Frisch-grid detectors may extend from the cathode down to the anode, i.e., full length, or the cathode may be extended further down the length of the semiconductor, the ability to measure cathode signals is substantially reduced. To overcome this limitation, the inventors have discovered that each virtual Frisch-grid detector, or more specifically each shielding electrode of each detector may be optimized individually by varying the length of the shield and the location of the detector within the detector array. In a preferred embodiment of the present invention, the location of the shield is close to the anode. A schematic illustration of a top plan view of a virtual Frisch-grid detector array of such embodiment is shown in FIG. 3. The virtual Frisch-grid detector array 700 comprises one or more sub-array(s) 600 with a varying number of the virtual Frisch-grid detectors within each sub-array. In one non-limiting embodiment, every detector within an array or sub-array is connected to form a common cathode. However, it is also envisioned that each array or sub-array may have two or more subgroups of virtual Frisch-grid detectors that are connected to a common cathode within that particular subgroup. In one embodiment, the virtual Frisch-grid detector array comprises one (1) sub-array. In another embodiment, the virtual Frisch-grid detector array may comprise more than one (1) sub-array, for example, 2, 4, 6, 8, or 9 sub-arrays. It will be appreciated and understood by those skilled in the art that the number of sub-arrays within the virtual Frisch-grid detector array of the present invention will depend on the desired parameters and extrinsic requirements, e.g., the overall size of the radiation detection system, and should not be limited to the embodiments exemplified herein.

The virtual Frisch-grid detector array (or sub-array) comprises a plurality of virtual Frisch-grid detectors that are configured in a matrix A(m,n), where m and n independently represent the number of rows and columns that may range from 1 to 1000 or more. While there is no specific requirement of how the plurality of virtual Frisch-grid detectors must be presented in the array, in one exemplary embodiment, A(4,4) describes a 4×4 matrix 600 with 4 rows and 4 columns as shown in FIG. 3. In another embodiment, A(6,6) describes a 6×6 matrix, which is shown as a cross section view in FIGS. 4A, 4B, and 4C.

In one embodiment, a virtual Frisch-grid detector array 300 comprises a module 310 comprising a plurality of virtual Frisch-grid detectors in a 6×6 matrix, i.e., 36 detectors. FIG. 4A shows one of the rows 1-6. Each virtual Frisch-grid detector within the array 300 has a shielding electrode 314 on a surface 313 near the an anode 315 extending a partial length of a semiconductor 312, thus, leaving the semiconductor 312 within the virtual Frisch-grid detector partially unshielded. The actual length of the shielding electrode 314 depends on the aspect ratio of the semiconductor 312. The longer the semiconductor 312, a relatively shorter shielding electrode 314 can be used leaving large fraction of device's volume for the cathode 301. Preferably, the shielding electrode should be at least equal to the width of the detector and independent of the device length. In one particular embodiment, the length of the shielding electrode 314 is about ⅓ of the total length of the semiconductor 312, thus, leaving about ⅔ of the semiconductor 312 unshielded. In another embodiment, the length of the shielding electrode 314 is about ¼ of the total length of the semiconductor 312, thus, leaving about ¾ of the semiconductor 312 unshielded. In yet another embodiment, the length of the shielding electrode 314 ranges between about ¼ and about ⅓ of the total length of the semiconductor 312, thus, leaving about ¾ to about ⅔ of the semiconductor 312 unshielded. The shield 314 may be longer or shorter depending whether the shield 314 is sufficient to provide the shielding of the anode 315, which can be optimized for a particular configuration of the semiconductor detector. The anode 315 of each detector in the array 300 is attached to a conductive board (or other conductive materials) 303 via a conductive connector (e.g., bond) 304. A cathode 311 of each detector in the array 300 is attached to a conductive board (or other conductive materials) 301 via a conductive connector (e.g., bond) 302. The conductive connector 302 and 304 may be, for example, an indium bump, a conductive epoxy, a spring connector, or a gold stump. The cathode 301 of each individual detector in the array 300 can either be read together, separately, or in sub-combination of detectors. In one embodiment, the cathode 301 of each individual detector in the array 300 is read together. In such configuration, the interaction depth information derived from the cathode signal of the virtual Frisch-grid detector array is used to correct the anode's charge loss due to electron trapping. Both the ratio between the cathode and anode signals and drift time given by the difference between the starting time of cathode signal and arrival time of the anode signal can be used to implement corrections of the cathode signals.

In another embodiment, a virtual Frisch-grid detector array 400 comprises an internal module 410 and an external (or edge) module 420 configured in a 6×6 matrix. FIG. 4B shows one of the rows 2-5. The internal module 410 comprises a plurality of virtual Frisch-detectors (e.g., 16 detectors for 4×4 internal matrix) with a shielding electrode 414 extending a partial length of a semiconductor 412 on a surface 413 near the anode 415, e.g., ¼ to ⅔ of the length of the semiconductor, thus allowing the semiconductor 412 to remain partially unshielded, e.g., ¾ to ⅔ unshielded. The edge module 420, on the other hand, comprises a plurality of virtual Frisch-detectors (e.g., 20 detectors) with a shielding electrode 424 on a surface 423 near an anode 425 extending further than the shielding electrode 414 of the detector(s) in the internal module 410, but still does not cover the semiconductor 422 completely. In one particular embodiment, if the length of the shielding electrode 414 is about ¼ to about ⅓ of the total length of the semiconductor 412, the length of the shielding electrode 424 of the edge module 420 is anywhere between the length of the shield 414 and the length of the semiconductor 422, e.g., 1>L(424)>¼. One skilled in the art will appreciate that the length of the shield 424 can be optimized for a particular configuration of the semiconductor detector array as long as the shield 424 is sufficient to provide the shielding of the overall array. The anode 425 of each detector in the array 400 is attached to a conductive board (or other conductive materials) 403 via a conductive connector (e.g., bond) 404. A cathode 411 and 421 of each detector in the array 400 is attached to a conductive board 401 via a conductive bond 402. Similar to an array described in FIG. 4A, the cathode 411 and 421 of each individual detector in the array 400 can either be read together, separately, or in sub-combination of detectors. In one embodiment, the cathode 411 of each individual detector in the internal module 410 is read together with the cathode 421 of each individual detector in the external module 420 in the array 400.

In another embodiment, a virtual Frisch-grid detector array 500 comprises an internal module 510 and an external (or edge) module 520 configured in a 6×6 matrix. FIG. 4C shows one of the rows 2-5. The internal module 510 comprises a plurality of virtual Frisch-detectors (e.g., 16 detectors for 4×4 internal matrix) with a shielding electrode 514 extending a partial length of a semiconductor 512 on a surface 513 near the anode 515, thus allowing the semiconductor 512 to remain partially unshielded. The edge module 520, on the other hand, comprises a plurality of virtual Frisch-detectors (e.g., 20 detectors) with a shielding electrode 524 extending the full length of the semiconductor 522 on a surface 523 between the edges of the cathode 521 and the anode 525. The anode 525 of each detector in the array 500 is attached to a conductive board (or other conductive materials) 503 via a conductive connector (e.g., bond) 504. A cathode 511 and 521 of each detector in the array 500 is attached to a conductive board 501 via a conductive connector (or bond) 502. A top view of a similar configuration, albeit shown as a 4×4 matrices are presented in FIG. 3, where the internal modules comprise the detectors with partial shield 614 and the external modules comprise the detectors with a full shield 624, and all the detectors are connected to the conductive board 601, e.g., via a conductive connector or bond 602. Similar to an array described in FIG. 4A and FIG. 4B, the cathode 511 and 521 of each individual detector in the array 500 in FIG. 4C can either be read together, separately, or in sub-combination of detectors. In such configuration, the interaction depth information derived from the cathode signal of the internal module in the virtual Frisch-grid detector array is used to correct the anode's signal due to electron trapping. In one embodiment, the cathode 511 of each individual detector in the internal module 510 is read together with the cathode 521 of each individual detector in the external module 520 in the array 500. Specifically, the interaction depth information derived from the cathode signal of the internal module 510 in the virtual Frisch-grid detector array 500 can be used to correct the anode's charge loss due to electron trapping. The correlation between the amplitude of the signals, $A_{anode}$ and $A_{cathode}$ (see FIGS. 6A-6B), generated by monoenergetic gamma rays and readout from the anode and the cathode in the virtual Frisch-grid detector array produces a negative slope of the narrow-dots continuum corresponding to the total energy deposition events, which is an indication of the electron charge loss that can be corrected as $$A_{cor} = A_{anode} + KA_{cathode} \tag{1}$$

where K is the slope of the correlation curve. Moreover, the ratio between the cathode and anode signals, $A_{cathode}/A_{anode}$, can be used to reject the events interacting close to the anode. Such events, represented by the dots located close to the vertical axis, degrade the spectral response of virtual Frisch-grid detector array. This provides a practical approach to use the cathode signal of the internal module to correct the anode's signal loss due to trapping in the whole system. The anode's signal loss due to electron trapping may also be corrected by using the drift time measured as a difference between starting time of the cathode signal and arrival time of the anode signal.

Virtual Frisch-Grid Detector

Figure 5A:
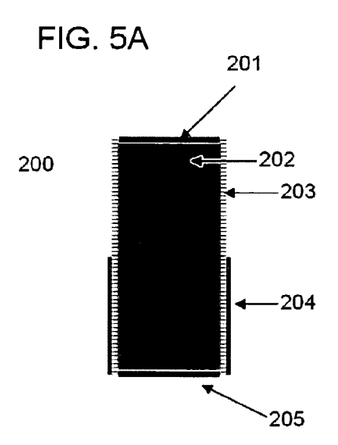
FIG. 5A illustrates the cross-sectional view of the virtual Frisch-grid detector with a shielding electrode extending a partial length of a semiconductor near the anode.
Figure 5B:
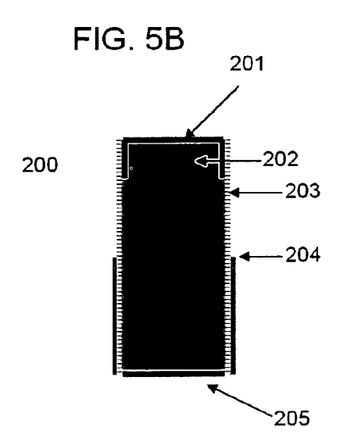
FIG. 5B illustrates the cross-sectional view of the virtual Frisch-grid detector of FIG. 5A with the cathode metallization extended up to the side surfaces of the semiconductor.

A schematic of various virtual Frisch-grid detector(s) of the present invention are shown, for example, in FIGS. 5A-5B, to be used in the array 300 shown in FIG. 4A and FIG.

4B or the internal module 510 of the array 500 as shown in FIG. 4C. The virtual Frisch-grid detector 200 (referenced to FIGS. 5A-5B) comprises a compound semiconductor 202 having a first surface (also can be referred to as top) and a second surface (also can be referred to as bottom). An anode 205 is connected to the first side of the semiconductor 202, and a cathode 201 is connected to the second side of the semiconductor 202. In one, non-limiting, embodiment, the cathode 201 and the anode 205 are made from platinum or other conducting material known in the art. The virtual Frisch-grid detector 200 further comprises a shielding electrode 204 surrounding the perimeter of the semiconductor 202 between the anode 205 and the cathode 201, which produces the virtual Frisch-grid effect. The shielding electrode 204 is positioned near the edge of the anode 205 and extends a partial length of the semiconductor 202, never reaching the edge of the cathode 201. Since a signal is induced at the anode 205 by the charge motion between the shielding electrode 204 and the anode 205, the shielding electrode 204 screens out the induced signal from slow moving positive ions drifting towards the cathode 201. Hence, placing the shielding electrode 204 near the anode 205 ensures that the origin of induced signal is from those electrons that drifted from the detector volume into the measurement region, thereby causing the signal to form mainly from electron motion. In one embodiment, the shielding electrode 204 in the detector 200 spans about 5% to about 95% of the semiconductor 202 length positioned at the edge of the anode 205. In more preferred embodiment, the shielding electrode 204 in the detector 200 spans about 15% to about 75% of the semiconductor 202 length positioned at the edge of the anode 205. In even more preferred embodiment, the shielding electrode 204 in the detector 200 spans about 25% to about 35% of the semiconductor 202 length positioned at the edge of the anode 205. We recognized that in the detectors of the present invention, the minimum size of the shield may be selected depending only on the device aspect ratio and placed next to the anode. The same shield size can be used for all detectors from the array (or internal module of the array). By contrast, the conventional detector arrays of prior art require different shields for each detector in the array because the conventional detectors need to be carefully optimized to achieve the best energy resolution depending on the properties of the individual crystals, applied bias, geometry, etc.

The virtual Frisch-grid detector 200 further comprises a side insulating layer 203, e.g., the ultra-thin polyester shrink tube, between the surface of the semiconductor 202 and the shielding electrode 204. The non-contacting virtual Frisch-grid detector eliminates grid-to-anode leakage current while still achieving single-carrier performance (see U.S. Pat. No. 6,175,120; incorporated herein by reference in its entirety). The side insulating layer 203 has a thickness adequate to provide excellent electrical isolation and to avoid dielectric breakdown between the anode 205 and any surfaces with a differential bias. In one particular embodiment, the side insulating layer has a thickness of about 10-2000 microns. In one embodiment, the insulating layer is from about 100 microns to about 2000 microns. In another embodiment, the insulating layer is from about 200 microns to about 1000 microns. In yet another embodiment, the insulating layer is about 300 microns. The side insulating layer 203 is made from an insulating material possessing very high electrical resistivity, high threshold for dielectric breakdown, and preferably high corrosion resistance. In one embodiment of the instant invention, the insulating material is machined or casted. The insulating material can be made from a metal oxide (e.g., an alumina, zirconium oxide or quartz), glass-ceramic (e.g., Macor™), polyimide (Kapton™), photoresist, polymers (e.g., polytetrafluoroethylene or Teflon™), plastics, carbide ceramics (e.g., SiC or $B_4C$), nitride ceramics (e.g., $Si_3N_4$, AlN, or BN) or a combination thereof.

In an alternative design, shown in FIG. 5B, the semiconductor 202, as in the virtual Frisch-grid detectors defined in FIG. 5A, has a first surface and a second surface. The cathode metallization 201 is extended down to the sides by about 1-30% of the total length of the semiconductor 202, for example, 2-3 mm. The non-contacting shielding electrode 204 covers the device's side surfaces up to the cathode's 201 edge and is kept at the same potential as the anode 205. The insulating layer 203 covers the entire area of the side surfaces. This provides decoupling of the non-contacting ring 204 and the cathode 201 and, at the same time, allows one to apply high differential bias (up to 3000 V and higher) between the cathode 201 and the shielding electrode 204.

Figure 5C:
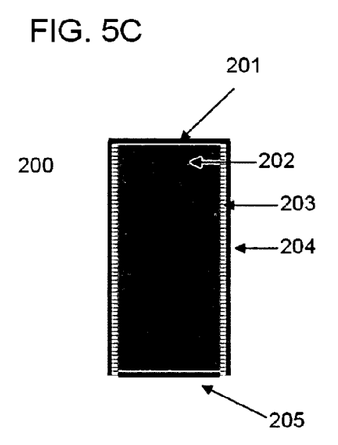
FIG. 5C illustrates the cross-sectional view of the virtual Frisch-ring detector of FIG. 5A with the shielding electrode extending the full length of a semiconductor used in the external module of the radiation detector array.
Figure 5D:
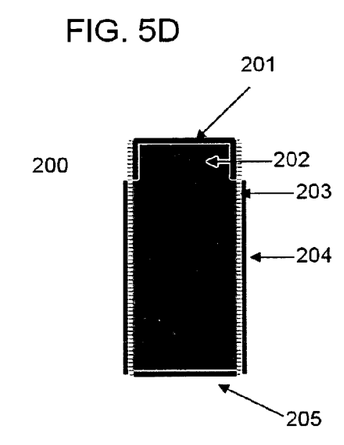
FIG. 5D illustrates the cross-sectional view of the virtual Frisch-grid detector of FIG. 5B with the shielding electrode extending the full length between the edge of the anode and the edge of the extended cathode used in the external module of the radiation detector array.

The virtual Frisch-grid detectors of the external or edge module, as shown in FIG. 5C and FIG. 5D, may resemble the configuration of the virtual Frisch-grid detectors of the prior art as long as the entire perimeter of the semiconductor 202 is covered by the shielding electrode 204, i.e., 100% from the first side to the second side of the semiconductor 202.

In either configuration of the detector, the semiconductor 202 is selected based on its ability to operate as a single-carrier-transport device. In particular, the compound semiconductors that may be employed in the present invention are generally derived from elements of groups III and V (e.g. GaAs) and groups II and VI (e.g. CdTe) of the periodic table. Besides binary compounds, ternary materials also may be used as the compound semiconductors capable of operating as a single-carrier-transport, e.g., $Cd_{1-x}Zn_xTe$ and $Cd_{1-x}Mn_xTe$, where $0 \leq x \leq 1$. It is common practice to omit the fractional subscripts when referring to the alloy families; such practice is followed in describing the present invention. Among these compound semiconductors and their alloys, in one embodiment, cadmium telluride (CdTe), cadmium zinc telluride (CdZnTe), cadmium manganese telluride (CdMnTe), thallium bromide (TlBr), or mercuric iodide ($HgI_2$) is used. However, it will be appreciated and understood by those skilled in the art that any compound or element may be used in the present invention as long as it is capable of operating as single-carrier-transport device, such as in addition to the semiconductors listed above, for example, HgCdTe, HgZnSe, GaAs, $PbI_2$, AlSb, InP, ZnSe, ZnTe, PbO, $BiI_3$, SiC, $Hg_xCd_{1-x}I_2$, $Hg_xCd_{1-x}I_2$, wherein x is greater than 0 and less than 1, $InI_2$, $Ga_2Se_3$, $Ga_2Te_3$, $TlPbI_3$, $Tl_4HgI_6$, $Tl_3As_2Se_3$, $TlGaSe_2$, and $AgGaTe_2$. In one particular embodiment, a semiconductor 202 is made from a cadmium zinc telluride (CdZnTe) crystal available from eV Microelectronics (373 Saxonburg Blvd., Saxonburg, Pa. 16056). One skilled in the art will appreciate that the semiconductor may be larger or smaller and vary in shape depending upon the design specifications. In one embodiment, the size of the semiconductor 202 is limited by the availability of a single crystal of highly uniform compound semiconductor. In another, non-limiting, embodiment, the aspect ratio of the semiconductor 202 is at least 2. In yet another embodiment, the semiconductor 202 has an aspect ratio of about 2.5 and the size parameters of about 6 mm by about 6 mm by 15 mm thick. In still another embodiment, the semiconductor 202 has an aspect ratio of about 2.8 and the size parameters of about 7 mm by 7 mm by 20 mm thick. In a preferred embodiment, the semiconductor 202 has an aspect ratio of about 2-2.4 and the size parameters of about 5-7 mm by 5-7 mm and 10 to 15 mm thick. The surface of the semiconductor 202 is prepared by surface passivation to provide a lower surface leakage current and stability over time, which can be achieved, for example, by polishing the semiconductor 202 followed by immersion into a suitable chemical. The suitable chemical for surface passivation can be selected from a bromine and methanol solution, hydrogen peroxide solution, ammonium fluoride, ammonium sulfide, HumiSeal™, or a combination thereof. Once, the semiconductor 202 is polished, the surface can also be processed with dry methods, such as coating with AlN or SiN, as a replacement to the immersion in a suitable chemical, or following the chemical immersion treatment.

While the virtual Frisch-grid detector and a detector array of the present invention have been described in connection with what is presently considered to be the most practical and preferred embodiment, it is to be understood that the invention is not to be limited to the disclosed embodiments, but on the contrary, is intended to cover various modifications and equivalent arrangements included within the spirit and scope of the appended claims.

EXAMPLES

The examples set forth below also serve to provide further appreciation of the invention but are not meant in any way to restrict the scope of the invention.

Example 1

To overcome the problem caused by electron trapping, the best practical approach is to use the cathode signal to correct the anode's signal loss due to electron trapping. In the design of virtual Frisch-grid detectors of prior art, the shield is extended up to the cathode, which, although enhances the shielding of the semiconductor, reduces the ability to measure cathode signals. Therefore, in the present invention we optimized the virtual Frisch-grid design for the individual CdZnTe bars and the CdZnTe array configuration.

The CdZnTe crystals were purchased from eV-Microelectronics, Inc. (373 Saxonburg Blvd., Saxonburg, Pa. 16056). The crystals were re-shaped into bar detectors with a geometric aspect ratio between approximately 2 and 3. Fabrication of the bar-shaped CZT detectors was conducted as described in Bolotnikov, et al. (*Proc. SPIE*, vol. 5540, 33-45, 2004, incorporated herein by reference in its entirety). The original crystals were hand polished and etched briefly with a 2% bromine/methanol solution. Electroless gold (Au) contacts were applied only to the ends, thereby forming the anode and cathode contacts. Afterwards, the side surfaces were polished further to reduce side-surface leakage current. To improve the device performance, the side surfaces of some of the samples were treated with a $NH_4F/H_2O_2$ solution (Wright, et al. *Proc. SPIE*, vol. 5198, pp. 306-313, 2004, incorporated herein by reference in its entirety). After the bar-shaped crystals were fabricated, their side surfaces were wrapped in Teflon tape followed by Cu tape. During the measurements, the detector under test was placed inside a standard eV-Products device holder (Bolotnikov, 2004) or a custom-made test box.

For those virtual Frisch-grid detectors acting as internal modules of the array, we reduced the shielding electrode length and left ⅔ of the CdZnTe bulk unshielded (see FIG. 4C and FIG. 5A). At the same time, we maintained the current virtual Frisch-grid design for those virtual Frisch-grid CdZnTe detectors at the edges of the array (see FIG. 4C and FIG. 5C), whose long shielding electrode ensures a good shielding efficiency for the whole array.

Figure 6A:
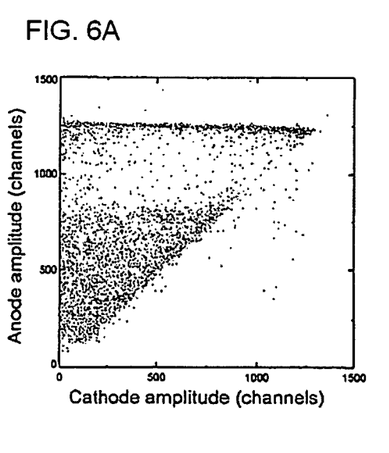
FIG. 6A graphically illustrates an example of a correlation between the signal amplitude from the cathode and the anode of the CdZnTe type detector array.

In this way, the interaction depth information can be achieved by reading the cathode signal of the internal modules, which was used to correct the anode's signal loss due to electron trapping. This is particularly important for long detectors, >10 mm, where electron trapping is significant. FIG. 6A is a graph representation that shows the correlation between the amplitude of the signals, $A_{anode}$ and $A_{cathode}$, generated by monoenergetic gamma rays and read out from the anode and the cathode in the 14-mm CdZnTe detector. The negative slope of the narrow-dots continuum corresponding to the total energy deposition events is an indication of the electron charge loss. Such events, represented by the dots located close to the vertical axes, degrade the spectral response of virtual Frisch-grid detectors.

Figure 7A:
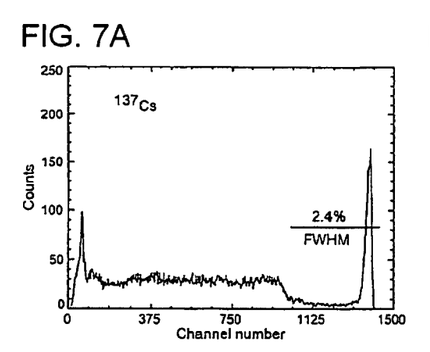
FIG. 7A graphically illustrates a pulse-height spectrum produced by an uncollimated $^{137}$Cs source with a 14-mm long CdZnTe type detector before correction.
Figure 7B:
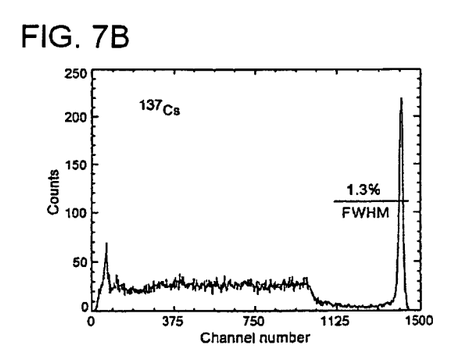
FIG. 7B graphically illustrates a pulse-height spectrum produced by an uncollimated $^{137}$Cs source with a 14-mm long CdZnTe type detector after correction relative to FIG. 7A.

A standard $^{137}Cs$ radioactive source was used to observe the spectroscopic properties of the detectors. The signals were measured with an eV Products 5092 preamplifier. The data acquisition system included a spectroscopy shaping amplifier, MCA card, digital oscilloscope to store waveforms readout from a charge-sensitive preamplifier, and standard NIM electronics. FIGS. 7A and 7B show two pulse-height spectra measured from a $^{137}Cs$ source with a 14-mm long Frisch-grid detector before and after applying the interaction depth correction and rejecting the events interacting close to the anode. The data was evaluated by measuring the waveforms from preamplifiers and applying the pulse-shape analysis. The low energy tail seen in the original spectrum (see FIG. 7A) is substantially reduced without losing photopeak counts by selecting the events with an $A_{cathode}/A_{anode}$ ratio greater than 0.005. As a result, the energy resolution (full width at half-maximum, FWHM) improves from 2.4% to 1.3% at 662 keV for the detector designed based on the present invention as seen in FIG. 7B.

Example 2

Figure 6B:
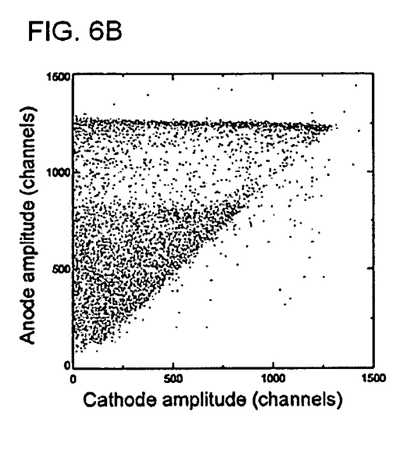
FIG. 6B graphically illustrates an example of a correlation between the signal amplitude from the cathode and the anode of the CdZnTe type detector array.
Figure 7C:
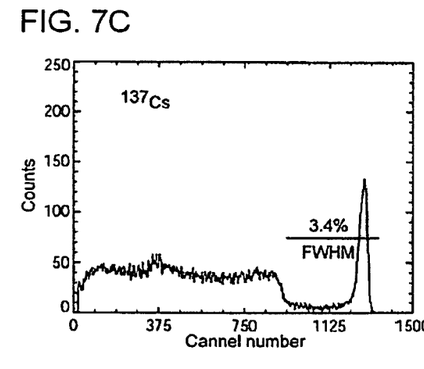
FIG. 7C graphically illustrates a pulse-height spectrum produced by an uncollimated $^{137}$Cs source with a 14-mm long CdZnTe type detector before correction.
Figure 7D:
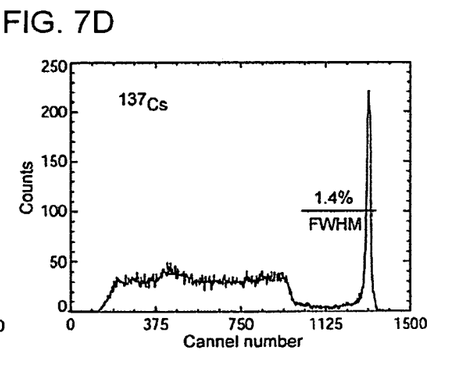
FIG. 7D graphically illustrates a pulse-height spectrum produced by an uncollimated $^{137}$Cs source with a 14-mm long CdZnTe type detector after correction relative to FIG. 7C.

The Experiment presented in Example 1 was repeated to demonstrate reproducibility of the present invention. FIG. 6B is a graph representation that shows the reproducibility in the correlation between the amplitude of the signals, $A_{anode}$ and $A_{cathode}$, generated by monoenergetic gamma rays and read out from the anode and the cathode. A standard $^{137}Cs$ radioactive source was used to observe the spectroscopic properties of the detectors. FIGS. 7C and 7D show two pulse-height spectra measured from a $^{137}Cs$ source with a 15-mm long Frisch-grid detector before and after applying the interaction depth correction and rejecting the events interacting close to the anode. The data was evaluated by measuring the waveforms from preamplifiers and applying the pulse-shape analysis. The low energy tail seen in the original spectrum (see FIG. 7C) is substantially reduced without losing of photopeak counts by selecting the events with an $A_{cathode}/A_{anode}$ ratio greater than 0.005. As a result, the energy resolution (full width at half-maximum, FWHM) improves from 3.4% to 1.4% at 662 keV for the detector designed based on the present invention as seen in FIG. 7D.

Thus, in this novel design, the deleterious effects caused by the electron trapping may be corrected without losing the shielding efficiency. The energy resolution and the detection efficiency improve accordingly.

It will be appreciated by persons skilled in the art that the present invention is not limited to what has been particularly shown and described. Rather, the scope of the present invention is defined by the claims which follow. It should further be understood that the above description is only representative of illustrative examples of embodiments. For the reader's convenience, the above description has focused on a representative sample of possible embodiments, a sample that teaches the principles of the present invention. Other embodiments may result from a different combination of portions of different embodiments.

The description has not attempted to exhaustively enumerate all possible variations. The alternate embodiments may not have been presented for a specific portion of the invention, and may result from a different combination of described portions, or that other undescribed alternate embodiments may be available for a portion, is not to be considered a disclaimer of those alternate embodiments. It will be appreciated that many of those undescribed embodiments are within the literal scope of the following claims, and others are equivalent. Furthermore, all references, publications, U.S. Patents, and U.S. Patent Application Publications cited throughout this specification are hereby incorporated by reference as if fully set forth in this specification.

The invention claimed is:

1. A virtual Frisch-grid detector array comprising
an internal module surrounded by
an edge module,
wherein each module comprises a plurality of virtual Frisch-grid detectors and said virtual Frisch-grid detectors comprise a semiconductor capable of operating as a single-carrier-transport device having a first surface and a second surface,
an anode connected to the first surface of the semiconductor,
a cathode connected to the second surface of the semiconductor, and
a shielding electrode producing the virtual Frisch-grid effect spanning the perimeter of the semiconductor between the first surface and the second surface;
wherein the virtual Frisch-detectors in the internal module have the shielding electrode extending a partial length of a semiconductor from the edge of the anode, and the virtual Frisch-detectors in the edge module have the shielding electrode extending a full length of a semiconductor.

2. A virtual Frisch-grid detector array according to claim 1, wherein the plurality of virtual Frisch-detectors in the edge module comprise the shielding electrode extending a less than ⅓ length of a semiconductor placed near the anode edge.

3. A virtual Frisch-grid detector array according to claim 1, further comprises a side insulating layer between the side surface of the semiconductor and the shielding electrode producing the virtual Frisch-grid effect.

4. A virtual Frisch-grid detector array according to claim 3, wherein the side insulating layer is made from an insulating material possessing very high electrical resistivity, high threshold for dielectric breakdown, and preferably high corrosion resistance.

5. A virtual Frisch-grid detector array according to claim 4, wherein the insulating material is machined or casted.

6. A virtual Frisch-grid detector array according to claim 4, wherein the insulating material is made from a metal oxide, glass-ceramic, polyimide, photoresist, polymers, plastics, carbide ceramics, nitride ceramics or a combination thereof.

7. A virtual Frisch-grid detector array according to claim 6, wherein the metal oxide is an alumina, zirconium oxide or quartz, the glass-ceramic material is Macor™ material, the polyimide material is Kapton™ material, the polymer is polytetrafluoroethylene (Teflon™), the carbide ceramics is SiC or $B_4C$, and the nitride ceramics is $Si_3N_4$, AlN, or BN.

8. A virtual Frisch-grid detector array according to claim 3, wherein the side insulating layer positioned between the side surface of the semiconductor and the metal electrode and has a thickness adequate to provide excellent electrical isolation and to avoid dielectric breakdown between the full-area metal anode and any surfaces with a differential bias.

9. A virtual Frisch-grid detector array according to claim 8, wherein the side insulating layer has a thickness of about 10-2000 microns.

10. A virtual Frisch-grid detector array according to claim 1, wherein the cathodes of the detectors in the array are connected together.

11. A virtual Frisch-grid detector array according to claim 1, wherein the aspect ratio of the semiconductor is at least about 2.

12. A virtual Frisch-grid detector array according to claim 1, wherein the shielding electrode in the detectors of the internal module extends about ⅓ of the total length of the semiconductor.

13. A virtual Frisch-grid detector array according to claim 12, wherein the shielding electrode is made from conducting metals.

14. A virtual Frisch-grid detector array according to claim 13, wherein the conducting metals is selected from copper (Cu) or aluminum (Al).

15. A virtual Frisch-grid detector array according to claim 1, wherein interaction depth information derived from the cathode signal of the internal module is used to correct the anode's charge loss due to electron trapping of the array.

16. A virtual Frisch-grid detector array according to claim 1, wherein the ratio between the cathode and an anode signals is used to reject the events interacting close to the anode.

17. A virtual Frisch-grid detector array according to claim 1, wherein the semiconductor is selected from the group consisting of Group III-V semiconductors and Group II-VI semiconductors.

18. A virtual Frisch-grid detector array according to claim 17, wherein the semiconductor is made from binary compounds, ternary compounds or ternary alloys.

19. A virtual Frisch-grid detector array according to claim 1, wherein the semiconductor is selected from the group consisting of CdZnTe, CdTe, CdMnTe, $HgI_2$, TlBr, HgCdTe, CdMnTe, HgZnSe, GaAs, $PbI_2$, AlSb, InP, ZnSe, ZnTe, PbO, $BiI_3$, SiC, $Hg_xBr_{1-x}I_2$, $Hg_xCd_{1-x}I_2$, wherein x is greater than 0 and less than 1, $InI_2$, $Ga_2Se_3$, $Ga_2Te_3$, $TlPbI_3$, $Tl_4HgI_6$, $Tl_3As_2Se_3$, $TlGaSe_2$, and $AgGaTe_2$.

20. A method of detecting radiation comprising:
a) providing a virtual Frisch-grid detector array according to claim 1;
b) allowing each individual virtual Frisch-grid detector in the internal and edge modules to absorb the radiation of interest by a photoelectric ionization of the semiconductor material;
c) determining the amplitude of the signals from the anode and the cathode of the internal module;
d) determining the ratio between the amplitude signals of the cathode and the anode in the internal module or determining the drift time as difference between the starting time of the cathode signal and arrival time of the anode signal;
e) correcting the anode signals by using the interaction depth information derived from the cathode signal of the internal module; and
f) rejecting of the incomplete charge signals by using the interaction depth information derived from the cathode signal of the internal module.

21. A method of detecting radiation according to claim 20, wherein the cathodes of the detectors in the array are connected together.

22. A method of detecting radiation according to claim 20, wherein the aspect ratio of the semiconductor is at least about 2.

23. A method of detecting radiation according to claim 20, wherein the shielding electrode in the detectors of the internal module extends about ⅓ of the total length of the semiconductor.

24. A method of detecting radiation according to claim 20, wherein the shielding electrode is made from conducting metals.

25. A method of detecting radiation according to claim 20, wherein the conducting metals is selected from copper (Cu) or aluminum (Al).

26. A radiation detector system comprising
a virtual Frisch-grid detector array according to claim 1,
an application-specific-integrated-circuit (ASIC) connected to the virtual Frisch-grid detector array operable to receive a signal from said array, and
a microprocessor connected with the ASIC operable to control the ASIC.

27. A virtual Frisch-grid detector array comprising
an internal module surrounded by
an edge module,
wherein each module comprises a plurality of virtual Frisch-grid detectors and said virtual Frisch-grid detectors comprise
a semiconductor with the aspect ratio of at least about 2 capable of operating as a single-carrier-transport device having a first surface and a second surface,
an anode connected to the first surface of the semiconductor, and
a cathode connected to the second surface of the semiconductor;
wherein the cathode of each individual detector in the array is connected together to form a common cathode,
wherein the virtual Frisch-grid detectors in the internal module have a shielding electrode extending about ⅓ of the total length of the semiconductor from the edge of the anode, and
the plurality of virtual Frisch-grid detectors in the edge module comprise the shielding electrode extending further in length than the shielding electrode of the virtual Frisch-detectors in the internal module.

28. A virtual Frisch-grid detector array according to claim 27, wherein the shielding electrode of the virtual Frisch-grid detectors in the edge module extends the full length of the semiconductor.

* * * * *